(12) United States Patent
De Ruiter

(10) Patent No.: US 7,439,600 B2
(45) Date of Patent: Oct. 21, 2008

(54) PHOTOVOLTAIC DEVICE FORMING A GLAZING

(76) Inventor: Adrianus De Ruiter, Sleutelbloem 70, NL-4823, CA Breda (NL)

( * ) Notice: Subject to any disclaimer, the term of this patent is extended or adjusted under 35 U.S.C. 154(b) by 0 days.

(21) Appl. No.: 10/525,522

(22) PCT Filed: Dec. 20, 2001

(86) PCT No.: PCT/EP01/15382

§ 371 (c)(1),
(2), (4) Date: Jan. 3, 2006

(87) PCT Pub. No.: WO02/50913

PCT Pub. Date: Jun. 27, 2002

(65) Prior Publication Data

US 2006/0138606 A1    Jun. 29, 2006

(30) Foreign Application Priority Data

Dec. 20, 2000  (FR) .................................. 00 16693

(51) Int. Cl.
*H01L 31/00* (2006.01)

(52) U.S. Cl. ................ 257/458; 257/443; 257/E27.125
(58) Field of Classification Search ................. 257/443, 257/458, 459, E27.124, E27.125
See application file for complete search history.

(56) References Cited

U.S. PATENT DOCUMENTS 4,461,922 A * 7/1984 Gay et al. .................... 136/249
4,865,999 A * 9/1989 Xi et al. ......................... 438/83

* cited by examiner

*Primary Examiner*—Matthew E. Warren
(74) *Attorney, Agent, or Firm*—Roylance, Abrams, Berdo & Goodman, L.L.P.

(57) ABSTRACT

The invention concerns a photovoltaic device (1) comprising a plurality of p-i-n type photovoltaic cells (2) arranged on a substrate (3), wherein said cells (2) are arranged, in the form of a single layer, parallel to one another and the electrical conductive layer (7) is arranged between the n layer (6) and the p layer (5) of each consecutive cell (2) so as to electrically connect said cells (2) in series. The invention also concerns the use of such a device (1) as glazing, a method for making such a device (1), a method for controlling a transparent photovoltaic device (1) as well as an installation for implementing said control method.

7 Claims, 2 Drawing Sheets

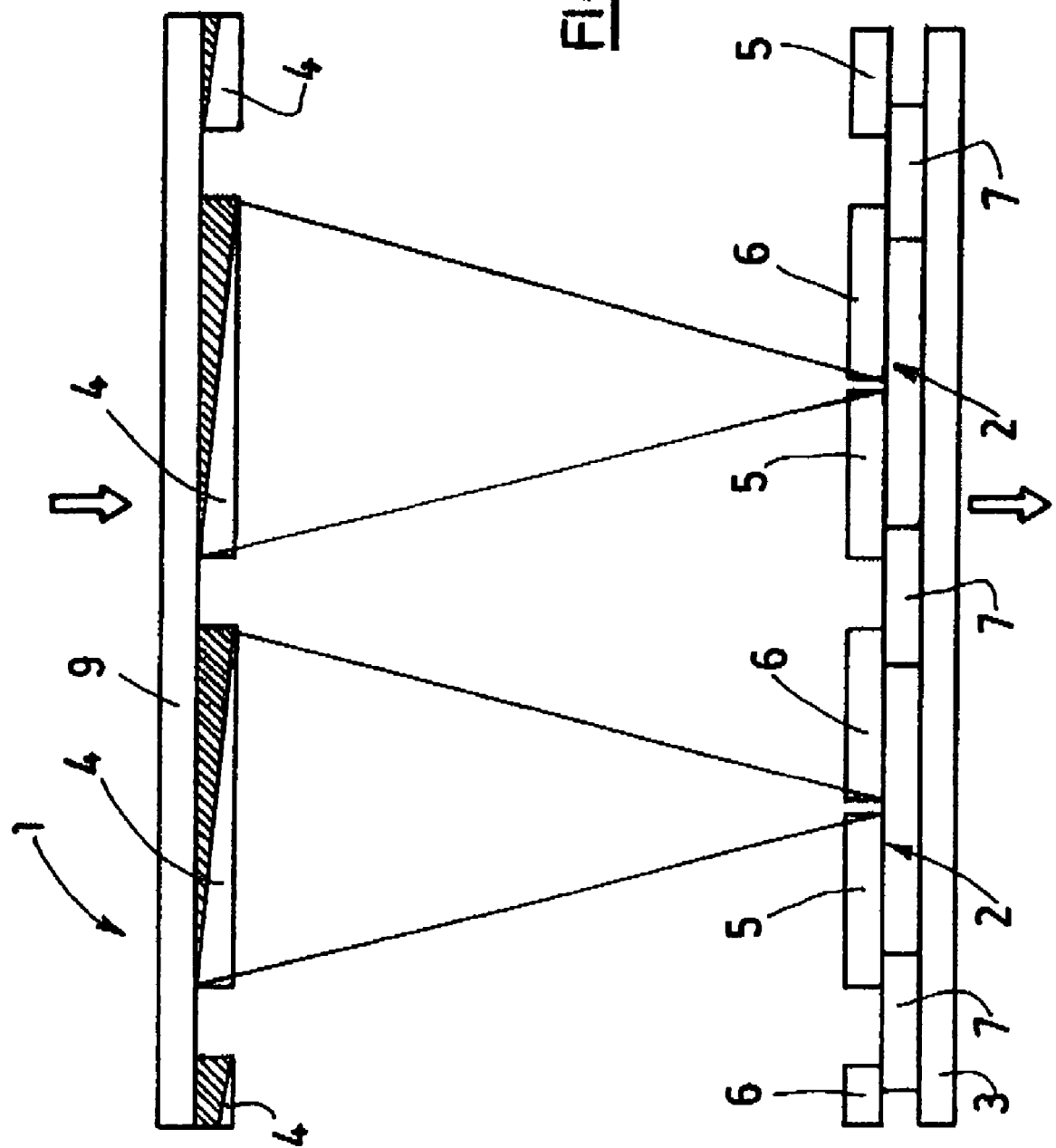

PHOTOVOLTAIC DEVICE FORMING A GLAZING

The invention concerns a photovoltaic device, the use of said device as glazing, a method for producing said device, an installation for implementing said method, a method for controlling a transparent photovoltaic device, as well as an installation for implementing said control method.

The present invention concerns a photovoltaic device in which several p-i-n type photovoltaic cells are arranged parallel to one another on a substrate, said cells being electrically connected in series.

It can normally be applied when the substrate is a tinted glass plate to be used for the external glazing of architectural buildings.

These tinted glass plates are widely used in the construction of office buildings, schools, hospitals and other buildings for attenuating the dazzling light, ensure absorption of one portion of the heat radiated by the sun and thus reduce the costs of carrying out air-conditioning.

In a large number of cases, polished plates for windows encompass an entire building and, owing to their exposure to solar radiation, could constitute a large source of electric energy if they were provided with a photovoltaic device.

Preliminary calculations indicate that, even with relatively low photovoltaic efficiencys, it would be possible to sufficiently generate current to satisfy part, if not all, the electric current needs of the building.

The document U.S. Pat. No. 4,271,328 describes a photovoltaic device having a tandem structure in which two, three or more than three photovoltaic unit cells each comprising a p-i-n semi-conductive joining point are stacked in series along the light propagation direction.

In this type of device, the light leaving the unit photovoltaic cell, without taking part in photovoltaic action, can be absorbed in the following photovoltaic cell so as to improve the overall photovoltaic efficiency of the device.

But the stacking of the photovoltaic cells along the propagation direction of the light has the drawback that an increase of the photovoltaic efficiency occurs to the detriment of the transparency of the photovoltaic device.

Thus, it is difficult to consider having these devices arranged on a glass substrate for glazing a building in that it needs to possess sufficient transparency for it to be used.

In addition, currently available photovoltaic devices are clearly limited as regards the tension and output.

In fact, as the incident light is successively absorbed by the various layers of the photovoltaic cell, the final cell receives less photons than the first so that its output is not optimum.

Therefore, the invention seeks to resolve these drawbacks by offering a photovoltaic device which is sufficiently transparent so as to be used as a glazing glass.

In addition, the outgoing electric voltage and the photovoltaic efficiency of the device of the invention are improved with respect to those of the prior art.

To this effect and according to a first characteristic, the invention concerns a photovoltaic device including a plurality of p-i-n type photovoltaic cells arranged on a substrate in which said cells are arranged in the form of a single layer, are parallel to one another and in that an electric conductive layer is placed between the n layer and the p layer of each consecutive cell so as to electrically connect said cells in series.

In a variant, the device is transparent to light rays.

According to a second characteristic, the invention concerns the use of this device as glazing for architectural buildings in which the substrate is formed by the glazing.

In a variant, the photovoltaic cells cover approximately the entire surface of the glazing so as to increase the amount of current generated per square metre of glazing.

According to a third characteristic, the invention concerns a method for producing a device as described above in which the various layers are laid using the chemical vapour phase deposit method.

According to one embodiment of the method, after preparing the substrate, the various layers are laid by using:
  a first mask whose openings correspond to the electric conductive layers;
  a second mask whose openings correspond to the n type layers;
  a third mask whose openings correspond to the p type layers;
  a fourth mask whose openings correspond to the i type layers,
  said masks being arranged on the glass plate so as to allow depositing of the respective layers.

In one variant, the first, second, third and fourth masks are used successively.

According to a fourth characteristic, the invention concerns an installation for implementing the method described above, said installation including a working space in which the substrate is placed, a chamber surrounding the working space, heating means, a separation of the working space and a cooling chamber.

According to a fifth characteristic, the invention concerns a method for optically controlling a transparent device such as the one described above in which the image of the device is observed on successive narrow strips along one or several segments of a specific line covering the desired width for examination, said image of the device being projected via transparency onto a nearby screen which retransmit it by only illuminating the device on one zone, also narrow, covering said segments of the read line.

According to a sixth characteristic, the invention concerns an installation for implementing said control method, said installation further including presentation elements of the device:
  a translucent diffusing screen placed opposite the position of the device as near as reasonably possible so as to have it avoid the trajectory of the latter concerning its movement of being placed on the installation and then removed;
  a linear camera receiver targeting the screen via its rear face;
  a fixed light transmitter placed beyond the location of the device so as to sufficiently homogeneously illuminate on the screen a narrow zone covering the selected segment (s) for examination and preferably by forming a spread-out thin beam operating via transparency.

Other objects and advantages of the invention shall appear on a reading of the following description with reference to the accompanying drawings.

FIG. 2 is a partially cutaway diagrammatic view showing the photovoltaic device of FIG. 1.

Figure 1:
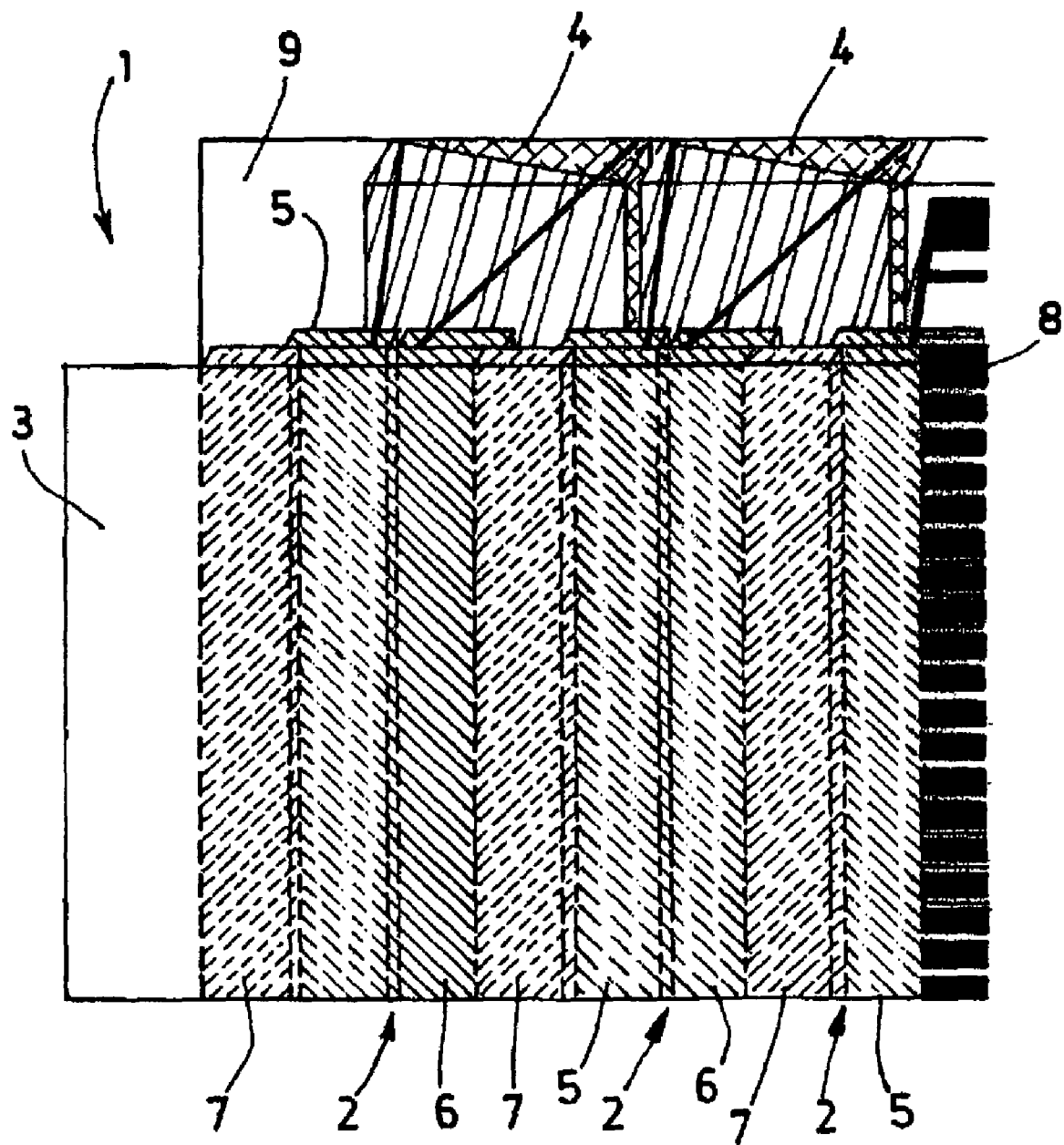
FIG. 1 is a rear perspective diagrammatic view partially showing a photovoltaic device including several unit photovoltaic cells arranged parallel to one another on a glass substrate.

With reference to the figures, a photovoltaic device 1 is described including several unit photovoltaic cells 2 arranged parallel to one another on a substrate 3 formed of a first glass plate.

Each photovoltaic cell 2 includes a p-i-n type semi-conductive joining point in which an i 4 type optically active layer is surrounded by respectively a p 5 type semi-conductive layer and an n 6 type semi-conductive layer.

To improve understanding of the invention, the layer i is represented enlarged and exploded on the figures, but needs to be viewed as being placed between the layers n and p 6, 5.

When this device 1 is subjected to an incident solar radiation, electron photo-carriers and holes are created in the i 4 type optically active layer.

Under the action of the electric field existing between the p 5 type layer and the n 6 type layer, the electrons move towards the n 6 type layer, whereas the holes move towards the p 5 type layer.

In this photovoltaic cell 2, it is therefore necessary to have, not only one optically active i 4 type layer actually taking part in the creation of electric energy in which no doping impurity is approximately present, but also layers doped by n 6 and p 5 type impurities so as to create an electric joining field.

When the circuit is closed by means of electric conductors 7 placed in contact with respectively the n 6 type layer and the p 5 type layer, there is then circulation of current in an external circuit (not shown).

The photovoltaic device 1 is thus able to convert the light energy emitted by the sun into electricity and the output of this conversion corresponds to the quantity of current obtained for a given light flow.

The layers p, i and n 5, 4, 6 of a photovoltaic cell 2 are arranged parallel to one another on the substrate 3 in the form of a single layer so that the photovoltaic action of each of the cells 2 is generated by the incident light.

This arrangement makes it possible to increase the photovoltaic efficiency since the optically active layer 4 of each photovoltaic cell 2 is subjected to the incident solar radiation without a portion of the latter having been absorbed by another layer of the cell 2 or by another cell 2 of the device 1.

Thus, the number of photo-carriers generated by the i 4 type layer of each photovoltaic cell 2 of the device 1 is optimum and thus the total photovoltaic efficiency of the device 1 increases.

Moreover, by adjusting the width of the prohibited optical strip of the optically active layer 4, it is possible to shift the peak wavelength from its photosensitivity so as to be able to be further increase the photovoltaic efficiency.

In addition, this embodiment is able to obtain a photovoltaic device 1 which is sufficiently transparent so as to be used as glazing for architectural buildings.

To this effect and after a large number of tests, the applicant has discovered that a photovoltaic cell 2 including gallium as an i 4 type layer and a p-n 5, 6 homojoining point formed of gallium arsenide giving good results in terms of total photovoltaic efficiency and electric output voltage.

For example, the p doping of gallium arsenide can be embodied by incorporating in it about 10% atomic weight of carbon and the n doping by incorporating with it about 10% atomic weight of nitrogen.

As these various types of doping are already known, no further details shall be given concerning this description.

In addition to their excellent electronic characteristics, the materials used, when they are laid in thin layers, exhibit sufficient transparency so as to be able to be used as glazing.

To this effect, the thickness of the layers p, i and n 5, 4, 6 can be about 25 Angstroms.

In addition and contrary in particular to photovoltaic devices using amorphous silicon, the photovoltaic efficiency of the device 1 does not lower significantly when it is subjected to an intense light radiation for a long period. This characteristic is obtained by virtue of the slight ageing of the gallium under the effect of the photons.

In the embodiment shown on the figures, the photovoltaic cells 2 are electrically connected in series by conductors 7 placed between each of them in thin layers on the substrate 3.

In one embodiment, the electric conductors 7 are formed of a layer of copper having approximately the same thickness as the layers p, i and n, said layer being respectively in contact with the layer p 5 and the layer n 6 of two consecutive cells 2.

In addition, the photovoltaic device 1 includes connection means 8 with an external circuit so as to collect the generated current. The connection means 8 are placed on the substrate 3, by example by etching, and in contact with the electric conductors 7 of the extreme photovoltaic cells 2 of the device 1.

In the embodiment shown exploded on the figures, a second glass plate 9 identical to the first is placed on the device 1 and in contact with the photovoltaic cells 2 so as to protect them.

During functioning of the device 1, the incident light (see the arrow on FIG. 2) is transmitted via the second glass plate 9 to all the type i 4 layers of the various unit cells 2 so as to create photocarriers which, under the action of the electric joining field, generate current in the set of cells 2 connected in series, the current then being recovered in the external circuit by means of connection means 8, the light then being transmitted through the device 1 (see the arrow on FIG. 2), that is towards the inside of the building via the substrate 3 and to be used as glazing.

As part of its use as glazing, another advantage of the device 1 is that, apart from the electric energy production, it is able to absorb the calorific energy via the Peltier effect and accordingly further reduce exploitation of the air-conditioning costs of buildings in which it is installed.

There follows below a description of the method for obtaining a photovoltaic device 1 according to the invention.

According to this method, the cells 2 can be embodied simultaneously with their electric circuit 7 so that the completed device 1 is ready to be installed.

The photovoltaic cells 2 and the electric conductors 7 are embodied in the form of thin coatings which are applied by means of vapour phase chemical depositing (CVD) directly on the fist glass plate 3.

Owing to its excellent surface condition and its other properties, the glass constitutes the best support for applying thin coatings. It is a nonconductor, resists corrosion and bad weather conditions and its low coefficient of expansion reduces the risk of fracturing of the coatings bound on its surface and when it is heated, the melting point of the glass corresponds to the melting points of the other active materials constituting the photovoltaic cells 2.

However and with the aim of preventing the migration of the sodium ions of the glass towards the photovoltaic cells 2 they could contaminate, it is desirable to render passive the surface of the glass, for example with an aluminium oxide prior to depositing of the various layers forming the cells 2.

Although the invention is applicable in particular to the field of glazing, the cells 2 can be deposited on a substrate 3 other than glass, for example a polished metal or formed of glass fibres, as a specific substrate able to be used for other applications.

In particular, satisfactory results have been obtained by depositing the photovoltaic cells 2 on polished metal.

The gas phase chemical depositing of metal materials or semi-conductors is already known thus its principle shall not be detailed in this description.

A specific and simple implementation method is a plasma spraying method, for example the high frequency heating of the materials constituting the cells 3 and the conductors 7 in the presence of an atmosphere free from hydrogen.

During implementing this method, masks are used which are arranged on the substrate 3 so as to deposit the gaseous compound on the desired location(s) and then separated from it after this depositing.

The masks can be either semi-permanent metal, carbon or plastic or be disposable after usage when made of impregnated paper or plastic.

The suggestion of using a mask to be disposed of after usage resides in the fact that, when the layers are deposited, material accumulates along the periphery of the openings of the mask so that following repeated uses, the shape of the openings has modified. Thus, the permanent masks need to be cleaned after each use.

The disposable mask has the advantage of being clean for each application.

Irrespective of the type of mask used, the latter needs to be fixed to the substrate 3 before each stage of depositing, this fixing being able to be embodied either automatically or manually.

The semi-permanent masks can be produced in metal or plastic materials impregnated with carbon or graphite, provided the materials to be deposited does not adhere or adhere only slightly above.

The masks to be disposed of after usage can be made of paper, the openings being cut or pierced in a roll of paper which continuously unwinds or in individual sheets cut to the dimensions of the substrate. For example, these masks can be coated with an adherent adhesive via pressure so as to be able to associate them temporarily with the substrate 3 for carrying out depositing. In this case, the adhesive can be laid in the form of points whose number and placing are arranged to allow association without damaging the substrate 3.

In addition, during the association stage and then disassociation of the mask from the substrate 3, it is essential to avoid any contamination or scratches of the substrate 3 which would adversely affect the performances of the photovolaic device 1.

Disposable masks have the advantage of allowing inspection of the product between application of the various layers, a different mask then being used for depositing each layer.

However and in the case where the substrate needs to be heated during or after the depositing of the layers, the choice of the material forming the mask needs to be made so that it does not deteriorate or warp under the effect of the temperature.

The first stage of the obtaining method of the photovoltaic device 1 is the preparation of the glass plate as a substrate 3.

During this stage, the glass plate is cut to the desired dimensions, the edges are trimmed and after cleaning at least the surface for receiving the cells 2 is rendered passive, for example with an aluminium oxide.

Next, the various layers of the photovoltaic device 1 are deposited by using:
  a first mask whose openings correspond to the layers of the electric conductors 7, said mask being placed on the glass plate, and copper is deposited by vapour phase chemical depositing, for example with a thickness of about 25 Angstroms;
  a second mask whose openings correspond to the type n 6 layers, said mask being arranged on the glass plate and then type n gallium arsenide is deposited by vapour phase chemical depositing, for example with a thickness of about 25 Angstroms;
  a third mask whose openings correspond to the type p 5 layers, said mask being placed on the glass plate and then type p gallium arsenide is deposited by vapour phase chemical depositing, for example with a thickness of about 25 Angstroms;
  a fourth mask whose openings correspond to the type i 4 layers, said mask being placed on the glass plate, and then the gallium is deposited by vapour phase chemical depositing, for example with a thickness of about 25 Angstroms.

Once the photovoltaic device 1 is embodied, the connection means 8 can be placed and then also the second glass plate 9 so as to obtain a photovoltaic device 1 forming the glazing glass which is ready to be mounted in architectural buildings.

There follows below a description of an installation for implementing the method for obtaining the photovoltaic device 1.

This type of installation typically includes a working space in which the substrate 32 is placed, a chamber which surrounds the working space, beating means, insulation of the working space, and a cooling chamber.

The transfer of heat from the working space to the wall of the chamber is basically effected by means of heat conduction, convection and radiation.

During placing under vacuum, the transfer of heat only takes place via radiation and the heat conduction of solid components and, when the pressure increases, the transfer of heat increases towards the wall of the chamber.

Damaging effects, such as an exaggerated temperature of the wall of the chamber having an effect of limiting the lifetime and reliability of the installation or an excessive consumption of energy or even an inadequate homogeneity of the temperature of the working space, appear if this transfer of heat is not controlled or reduced.

These installations are described in the documents DE-30 14 691 and U.S. Pat. No. 4,398,702. So as to mitigate the drawbacks mentioned above, in addition to the characteristics described in these documents, the invention specifies that:
  1) an additional insulation needs to be placed in front of the wall of the chamber;
  2) the insulation of the wall of the chamber is embodied with sheets and/or metal plates;
  3) the insulation of the working space is constituted either by hard felt plates with graphite sheet plating impermeable to the gases, said plates being placed on the lateral walls, the upper covering wall and the frontal walls, or the upper edges and joints are covered with graphite corner-shaped sections reinforced by carbon fibres so as to obtain imperviousness with respect to the passages of gases, whereas the lower edges are open so as to allow evacuation of said gases;
  4) the corner-shaped sections are arranged alternately repeated between the hard felt plates so as to establish a labyrinth type imperviousness;
  5) the frontal edges of the insulation of the working space and/or the conjugated surfaces are fixed in the reinforced graphite sections by carbon fibres;
  6) partitions are placed as anti-convection barriers between the insulation of the working space and the insulation of the wall of the chamber;
  7) the partitions are made of a metallic material in the form of sheets and/or steel plates;
  8) an additional cooling by water is placed between the insulation of the wall of the chamber and the wall of the chamber
  9) the additional cooling by water is placed in the upper half of the chamber close to the flange and the cover.

The first and second characteristics have the effect of creating a sharp fall of temperature at the level of the internal wall of the chamber so as to be able to maintain a low temperature at this location.

With the characteristics 3) and 4), insulation is improved at particularly critical locations. For example, in the case where the working space has a polygonal section at the level of the joining point between two walls. In fact, these joining points exhibit residual intervals which, in installations of the prior art, increase over a period of time and thus can be the cause of a defective insulation.

This damaging effect can be avoided by covering the intervals, but then certain difficulties appear. In fact, from the point of view of shaping, metal sheets would be suitable for covering the angles and edges, but as the insulation of the working space is constituted by graphite felt, a covering with narrow contact would lead to chemical reactions and, during heat expansion, to mechanical stresses which adversely affect the efficiency of the installation.

These difficulties can be overcome if, for covering, the same material is used as the one constituting insulation of the working space, namely graphite. However, conventional graphite materials are excluded as they are unsuitable to embody sealed joints in the corners and on the edges on account of their excessive fragility.

Graphite materials reinforced by carbon fibres and able to be embodied according to any selected section are nevertheless available. The use of corner-shaped sections constituted by this material for covering the residual intervals at the level of the corners and edges constitutes the best possible solution to the problem mentioned above.

In addition, if these elements are arranged in several copies between the various insulation layers of the working space, a labyrinth type sealing is obtained and accordingly an additional improvement of insulation of the working space.

Similar critical locations are found on the frontal edges of the insulation of the working space where, owing to frequent openings and closings, the surfaces used for insulation are exposed to excessive wear. The arrangement shown at 5) can resolve this problem and can obtain reliable and effective insulation.

The partitions described at 6) and 7) prevent convection and thus reduce the transfer of heat from insulation of the working space towards the wall of the chamber or towards the insulation of the wall of the chamber.

An additional cooling located on the sides of the cover of the chamber is described at the points 8) and 9). This cooling is necessary as the normal cooling of the chamber is inadequate owing to the considerable thickness of the wall where the flange and cover are located.

During functioning and in conditions of equilibrium, a constant temperature exists on the working space owing firstly to the quantity of heat brought by the heating means, and secondly the amount of heat evacuated outside the installation from the working space towards the wall of the chamber by means of conduction, radiation and/or heat convection.

By virtue of the characteristics indicated at points 1) and 2), a reduction of the convection in front of the wall of the chamber is obtained and as a result the drawing up of a higher temperature gradient so that the temperature in front of the wall of the chamber is reduced.

By means of the characteristics 3) to 5), the quantity of heat transmitted by convection from the working space to the other volumes of the chamber is reduced.

By virtue of the characteristics 6) and 7), the component of the quantity of heat transmitted by convection is reduced.

The characteristics 8) and 9), by means of improving heat evacuation, have the effect of reducing the temperatures of the chamber where the flange and cover are situated.

There follows below a description of the method for the optical control of a transparent photovoltaic device 1.

The term 'transparent' relates to a device 1 through which the light is able to pass by allowing the objects located behind to appear with sufficient cleanness.

The oldest technical methods for examining translucent bodies used to consist of examining them by turning them by hand in front of light source, preferably constituted by a strongly lit white background so as to observe them as they pass.

The modern control methods electronically analyse stage by stage the fluctuations of a signal retransmitted by the body from a suitable light source. They are especially used for controlling articles having at least a partially axial system, in particular articles made of glass, such as bottles, drinking glasses, or even made of plastic.

As regards reading a relatively wide zone of the surface, this is carried out column by column by strictly analysing the successive strips of the wall in successive unwinding planes parallel to the axis.

A synthesis is then carried out according to all types of criteria so as visualise the position, extent and in particular the intensity of each defect, but generally speaking, neither the selected methods of analysis nor synthesis directly depend on the mode of observation. In this case, they are outside the objective of the method and shall not be described below.

The most precise methods operate at a fixed station or sometimes with the aid of tracking devices and, as regards lighting, generally scan the height of the article with a narrow brush such as a synchronised quasi-punctual laser brush whilst it rotates by a full revolution.

A simplification consists of illuminating the entire zone to be examined by placing the device 1 in front of permanent light source possibly modulated, regardless of whether it is a concentrated source or one with a light background. It is still possible to operate by rotation on one revolution or only on moving past but under several additional angles, and if essential under a single one. A more concise analysis is thus obtained but faster and which is sufficient in a large number of cases.

As regards hollow articles, the light only makes one crossing so that the image observed then in some way forms the shadow of a line of the wall close to the screen. More frequently however, it makes two crossings so that the image then also reflects some defects of the most distant wall.

The method of the invention is drawn from this method whilst allowing a precise analysis of the device to be verified. It consists of observing on successive narrow strips along one or several segment(s) of a specific line covering the desired test width the image of the device 1 projected by transparency onto a nearby screen which rediffuses it by only illuminating the device 1 on a narrow zone covering said segments of the reading line.

Generally speaking, it is preferable, especially for rotating devices 1, to carry out rotation along the meridians or successive main generating lines.

The description mainly refers to this type of control, but in certain cases it could be operated during moving past, transposition being immediate.

So as to illuminate the various segments of the inspection zone, it is preferable to use a directed beam having, at least transversally, a small opening. Finally, the image formed on the screen shall almost inevitably remain observed via the "rear" face of the latter, namely the one which does not face the device 1, that is through this screen.

Apart from the conventional elements of the device 1 at the control station, an installation for implementing the optical control method shall thus include a fixed station or, if appropriate, on a tracker mounting:

a translucent diffusing screen placed opposite the position of the device 1 as close as reasonably possible so as to in particular have it avoid the path of the latter in its placing movement on the installation and then of evacuation, a linear camera receiver aimed at the screen via its rear face, a fixed light transmitter placed beyond the location of the device 1 so as to homogeneously illuminate on the screen a narrow zone covering the selected inspection segment(s) preferably by forming a spread out thin beam operating by transparency.

As regards the devices 1 with total or partial axial symmetry, such as most glazing glass, the presentation and mainly the rotating elements are usually associated with a reference horizontal plate and all the optical elements of the device shall be placed along a given plane of symmetry of the station perpendicular to the crossing path of the latter aimed at an inspection line principally close enough to a meridian. As most current machines use plate or vertical axis barrel conveyors, this plane shall thus be a vertical plane passing through the axis of the machine. However, it is possible to operate obliquely, and in separate planes close to the latter, possibly slanted on the axis if necessary through at least one wall.

In practice, a receiver comprising a camera combing a conventional lens and a photosensitive element constituted by a single diode rectilinear bar is suitable for observing with the desired precision the image supplied by all the zones to be examined.

Advantageously, it shall be provided with a return mirror to enable it to be orientated so as to be able to place it at the desired distance so as to cover the entire height to be controlled without creating excessive lateral congestion. It is also possible to use a optical fibre light guide.

The screen could be constituted only of a narrow translucent flat small plate formed of an opal or glass sheet on its front face, but if necessary, it could also include a juxtaposition of the faces oriented according to a basically prismatic position along the profile of the path in question. As a variant, it can have a curved surface, namely that of a cross section or at least not very oblique of a cylinder with an axis perpendicular to the plane of symmetry. Thus, it shall follow the shape of the device 1 at a distance of for example between 1 and 3 centimetres. This distance shall remain constant without however there being any excessive winding creating any difficulties, either as regards the construction or even observing the device as regards the lighting or focussing angles or otherwise the field depth.

The thinner the screen is, the better shall be the precision and sensitivity of analysis.

As regards the transmitter, a single concentrated light source suffices which is diaphragmed by a window which creates a thin beam.

However, it is also possible to use a projector using an optical system with linear or punctual source emitting a narrow beam basically diaphragmed by a flat beam so as to illuminate the selected inspection segments by passing through the axis of symmetry of the device 1 or at least close to it. So as to enable the screen to retransmit a uniform light flow towards the receiver a sufficiently uniform luminous flux, as a variant, several of these projectors can be associated, each illuminating its own section under an adjustable intensity with a possible covering of successive radiant fields so as to generate a uniform radiant field or even correct the influence of angular gaps. This transmitter could also be equipped with a return optical system.

As already specified above, for reasons of gaining advantages, such as obtaining more space, the positions of the elements could be spaced from the said symmetry with respect to a main section, the receiver and the transmitter being adjustable and focussed on the screen according to nearby but different average illumination and observation planes, both being basically parallel to the axis of the device 1 in the control position or slightly slanted on it.

There now follows a description of first and second embodiments of the installation for implementing the method for optically controlling a transparent device 1.

The device 1 is mounted on a conventional machine, the device 1 resting on a horizontal plate so the its axis is vertical. It is driven by a star wheel carrying rollers which enable an external counter-roller to make it rotate at the control station. This concerns an arrangement selected for convenience and thus is not described in detail.

In the first embodiment, the screen is formed of a narrow cylindrically curved translucent thin plate made of opal plastic placed transversally to the plane of symmetry along the main generating line or external median of the device 1 in a control position without moreover exactly following its curve.

The receiver comprises a camera whose lens is placed in front of photosensitive diode rectilinear bar connected to a preamplifier. This unit is situated inside a box bearing a return mirror which, when facing the rear face of the screen, makes it possible to vertically orientate the lens so as to reduce the horizontal spatial requirement and to focus it on the screen.

The transmitter is formed of a simple lamp fitted with a reflector and placed towards the inside of the machine under the reference plate where a rectilinear window diaphragms its light into a thin beam forming on the screen astride the median plane a light zone which covers the segment to be examined.

In the presence of a device 1, a single wall is crossed so that any possible defects of the device shall be expressed by local variations of illumination. The latter detected by the device shall indicate these defects and, if appropriate, a suitably time delay device shall then make it possible to move away the device 1.

In the second embodiment, the translucent screen is formed of a flat glass plate unpolished on its front face orientated towards the device 1 and passing close enough to the corresponding main generating line.

The receiver and transmitter are thus placed side by side above the path of the device 1.

The receiver, similar to that of the first embodiment, has its camera directed from top to bottom towards a reflecting mirror slanted at about 40° from vertical in an extremely slight oblique transversal arrangement, which makes it possible to focus it on the screen along the closest generating line by appropriately orientating the diode bar. The transmitter includes a projector directed from top to bottom towards a reflecting mirror, also slightly moved out of centre and slanted at about 40° from vertical so as to fold up the beam illuminating the screen in a slightly descending direction.

As for the receiver, said arrangement makes it possible to move the projector to a sufficient distance without taking up any excessive space.

A slot is made in the plate so as to enable the light rays to pass through.

The projector with a conventional structure has a lamp and a capacitor formed of two lens currently associated with a concave mirror so as to form at a short distance the image of its filament, the light being picked up by a lens.

As the source is not punctual, the mirror, despite its shape, would only diaphragm imperfectly into a flat beam the beam emitted by the projector. This is why it is necessary to adjust the lens on a field diaphragm bearing a slot, for example measuring 0.7 mm on 15 mm, placed close to the image but slightly put out-of-focus so that in the region of the screen in the absence of the device 1 to be controlled, a narrow rectangular image is formed fifteen to twenty times greater or practically with virtually homogeneous luminosity.

The invention claimed is:

1. A photovoltaic device comprising a plurality of photovoltaic cells of a p-i-n type placed on a first substrate, wherein said cells are positioned parallel to one another and wherein electrically conductive layers connect a p-type layer of each cell with an n-type layer of an adjacent cell on one side and connect the n-type layer of said same cell with the p-type layer of the adjacent cell on the other side, except for cells located at an outer border of the photovoltaic device, so as to electrically connect all the consecutive cells of the photovoltaic device in series, wherein at least the p-type layer and the n-type layer of a photovoltaic cell of the photovoltaic device are both located in the same layer on the first substrate, parallel to one another and on top of the electrically conductive layer, wherein said p-type layer and said n-type layer are of equal thickness.

2. The photovoltaic device according to claim 1, wherein of every photovoltaic cell, the n-type layer is formed of n-doped gallium arsenide, the p-type layer is formed of p-doped gallium arsenide, an i-type layer is formed of gallium and the electrically conductive layers are formed of copper.

3. The photovoltaic device according to claim 2, wherein the i-type layers of all photovoltaic cells of the photovoltaic device are formed in one layer, separated by gaps, on a second substrate, and that one lateral side of the i-type layer of every photovoltaic cell is electrically connected to the p-type layer of the respective photovoltaic cell, and the other lateral side of the i-type layer is electrically connected to the n-type layer of the respective photovoltaic cell and said electrical connections are formed by using electrically conductive wiring.

4. The photovoltaic device according to claim 3, wherein by varying the width of the gaps between the i-type layers on the second substrate, the peak wavelength in the photosensitivity of the photovoltaic device can be adjusted.

5. The photovoltaic device according to claim 1, wherein said first and second substrates are formed by glass plates, whereby the second substrate forms a top side and the first substrate forms a lower side of the photovoltaic device so that the i-type layer on the second substrate faces the layer containing both the p-type layer and the n-type layer on the first substrate, whereby there is a space between said facing layers and whereby the photovoltaic device is sufficiently transparent in the visible light wavelength range, so as to enable the use of the photovoltaic device as glazing for architectural buildings.

6. A method for producing the photovoltaic device according to claim 1, wherein the layers of the cells of the device are deposited in a vapour phase chemical deposit (CVD) process according to the sequence: first substrate: electrically conductive layer, n-type layer, p-type layer, second substrate: i-type layer.

7. The method for producing the photovoltaic device according to claim 6, wherein for the CVD process permanent masks made of metal, carbon or plastic are used, or disposable single-use masks of impregnated paper or plastic are used.

* * * * *